(12) United States Patent
Rops et al.

(10) Patent No.: US 12,529,964 B2
(45) Date of Patent: Jan. 20, 2026

(54) FLUID HANDLING SYSTEM, METHOD AND LITHOGRAPHIC APPARATUS

(71) Applicant: ASML NETHERLANDS B.V., Veldhoven (NL)

(72) Inventors: Cornelius Maria Rops, Waalre (NL); Giovanni Luca Gattobigio, Eindhoven (NL); Erik Henricus Egidius Catharina Eummelen, Veldhoven (NL); Dennis Van Den Berg, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 153 days.

(21) Appl. No.: 18/555,192

(22) PCT Filed: Mar. 10, 2022

(86) PCT No.: PCT/EP2022/056151
§ 371 (c)(1),
(2) Date: Oct. 12, 2023

(87) PCT Pub. No.: WO2022/218616
PCT Pub. Date: Oct. 20, 2022

(65) Prior Publication Data
US 2024/0248411 A1 Jul. 25, 2024

(30) Foreign Application Priority Data
Apr. 15, 2021 (EP) .................................... 21168491

(51) Int. Cl.
*G03F 7/00* (2006.01)
(52) U.S. Cl.
CPC ...... *G03F 7/70341* (2013.01); *G03F 7/70808* (2013.01); *G03F 7/70875* (2013.01)

(58) Field of Classification Search
CPC ............. G03F 7/70341; G03F 7/70808; G03F 7/70875; G03F 7/70891
See application file for complete search history.

(56) References Cited

U.S. PATENT DOCUMENTS

| 6,952,253 B2 | 10/2005 | Lof et al. |
| 7,133,114 B2 | 11/2006 | Hoogendam et al. |

(Continued)

FOREIGN PATENT DOCUMENTS

| CN | 103969964 A | 8/2014 |
| CN | 104597720 A | 5/2015 |

(Continued)

OTHER PUBLICATIONS

International Search Report dated Jun. 24, 2022, issued in corresponding International Application No. PCT/EP2022/056151 (4 pgs.).

(Continued)

*Primary Examiner* — Hung V Nguyen
(74) *Attorney, Agent, or Firm* — Pillsbury Winthrop Shaw Pittman, LLP

(57) ABSTRACT

A fluid handling system for a lithographic apparatus, the fluid handling system configured to confine immersion liquid to a liquid confinement space between a part of a projection system and a surface of a substrate in the lithographic apparatus wherein a radiation beam projected from the projection system can irradiate the surface of the substrate by passing through the immersion liquid, the fluid handling system including: a liquid extraction member, having an inlet side and an outlet side, that is arranged to extract the immersion liquid from the liquid confinement space by a fluid flow from the inlet side to the outlet side; and a further liquid supply to the outlet side of the liquid extraction member arranged so that the outlet side receives (Continued)

liquid from a different source than the liquid confinement space.

20 Claims, 6 Drawing Sheets

(56) References Cited

U.S. PATENT DOCUMENTS

| | | | | |
|---|---|---|---|---|
| 7,397,533 | B2* | 7/2008 | Verhagen | G03F 7/70808 355/53 |
| 8,634,059 | B2* | 1/2014 | De Graaf | G03F 7/70341 355/53 |
| 12,072,636 | B2* | 8/2024 | Polet | G03F 7/2041 |
| 2006/0038968 | A1 | 2/2006 | Kemper et al. | |
| 2006/0221315 | A1 | 10/2006 | Beckers et al. | |
| 2009/0237638 | A1 | 9/2009 | Nishikawara et al. | |
| 2010/0296967 | A1 | 11/2010 | Thomas et al. | |
| 2013/0169944 | A1* | 7/2013 | Nishii | G03F 7/70341 355/30 |
| 2018/0299789 | A1 | 10/2018 | Hara et al. | |

FOREIGN PATENT DOCUMENTS

| | | |
|---|---|---|
| CN | 104965392 A | 10/2015 |
| CN | 104035290 B | 11/2015 |
| CN | 105045046 A | 11/2015 |
| NL | 2024254 A | 12/2019 |
| NL | 2025219 A | 5/2020 |
| WO | 99/49504 A1 | 9/1999 |

OTHER PUBLICATIONS

Written Opinion of the International Searching Authority dated Jun. 24, 2022, issued in corresponding International Application No. PCT/EP2022/056151 (7 pgs.).

Anonymous, "A Fluid Handling System, Method and Lithographic Apparatus", Research Disclosure, No. 681087, 36 pages (Dec. 21, 2020).

Anonymous, "A Fluid Handling System, Method and Lithographic Apparatus", Research Disclosure, No. 682047, 41 pages (Jan. 13, 2021).

* cited by examiner

FLUID HANDLING SYSTEM, METHOD AND LITHOGRAPHIC APPARATUS

This application is the U.S. national entry of PCT patent application no. PCT/EP2022/056151, which was filed on Mar. 10, 2022, which claims the benefit of priority of European patent application no. 21168491.5 which was filed on 15 Apr. 2021, and which is incorporated herein in its entirety by reference.

FIELD

The present invention relates to a fluid handling system and a device manufacturing method. The present invention also relates to the lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Further improvements in the resolution of smaller features may be achieved by providing an immersion fluid having a relatively high refractive index, such as water, on the substrate during exposure. The effect of the immersion fluid is to enable imaging of smaller features since the exposure radiation will have a shorter wavelength in the fluid than in gas. The effect of the immersion fluid may also be regarded as increasing the effective numerical aperture (NA) of the system and also increasing the depth of focus.

The immersion fluid may be confined to a localized area between the projection system of the lithographic apparatus and the substrate by a fluid handling structure. The flows of the immersion fluid need to be appropriately controlled during operation of the lithographic apparatus.

There is a general need to increase the throughput of components lithographic apparatus. This requires new techniques for appropriately controlling the flows of immersion fluid within the lithographic apparatus.

SUMMARY

It is an object of the present invention to provide a fluid handling system in which measures are taken to increase throughput and/or reduce defects on a substrate.

According to a first aspect of the present invention, there is provided a fluid handling system for a lithographic apparatus, the fluid handling system configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a liquid extraction member, having an inlet side and an outlet side, that is arranged to extract the immersion liquid from the liquid confinement space by a fluid flow from the inlet side to the outlet side; and a further liquid supply to the outlet side of the liquid extraction member arranged so that the outlet side receives liquid from a different source than the liquid confinement space.

According to a second aspect of the invention, there is provided a fluid handling system for a lithographic apparatus, the fluid handling system configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a liquid supply that is a liquid supply to the liquid confinement space; and a liquid extraction member that is arranged to extract substantially only liquid from the liquid confinement space; wherein: the liquid supply is arranged to extend round at least part of the perimeter of the liquid confinement space; the liquid extraction member is arranged to extend round at least part of the perimeter of the liquid confinement space; and the liquid extraction member and the liquid supply cover substantially all of the perimeter of the liquid confinement space.

According to a third aspect of the invention, there is provided a lithographic apparatus comprising the fluid handling system of the first or second aspect.

Further embodiments, features and advantages of the present invention, as well as the structure and operation of the various embodiments, features and advantages of the present invention, are described in detail below with reference to the accompanying drawings.

DESCRIPTION OF THE DRAWINGS

Embodiments of the invention will now be described, by way of example only, with reference to the accompanying schematic drawings, in which corresponding reference symbols indicate corresponding parts, and in which.

The features shown in the figures are not necessarily to scale, and the size and/or arrangement depicted is not limiting. It will be understood that the figures include optional features which may not be essential to the invention. Furthermore, not all of the features of the apparatus are depicted in each of the figures, and the figures may only show some of the components relevant for describing a particular feature.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
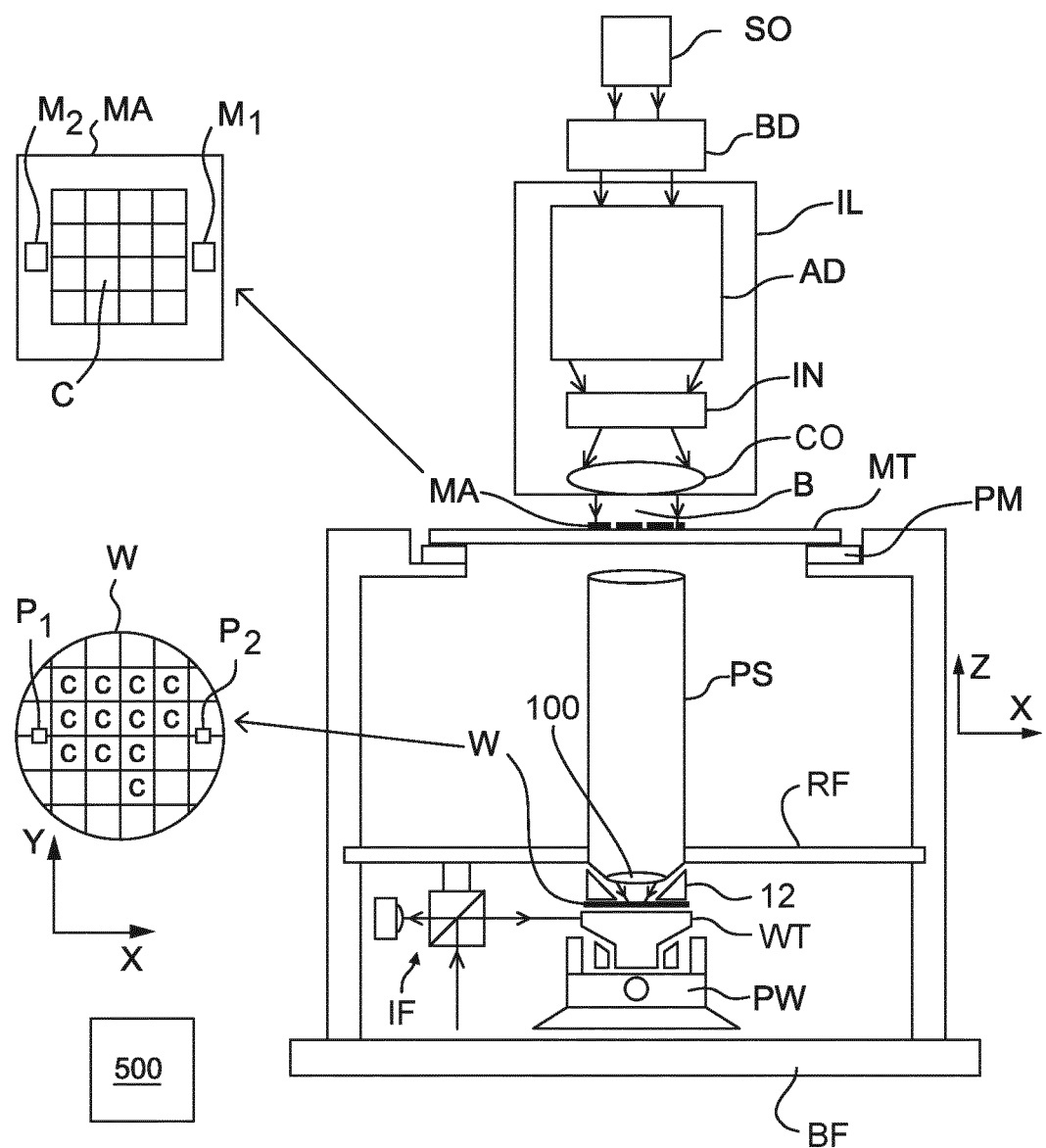
FIG. 1 depicts the schematic overview of the lithographic apparatus.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W. A controller 500 controls the overall operation of the apparatus. Controller 500 may be a centralised control system or a system of multiple separate sub-controllers within various sub-systems of the lithographic apparatus.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus is of a type wherein at least a portion of the substrate W may be covered by an immersion liquid having a relatively high refractive index, e.g., water, so as to fill an immersion space 11 between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in figures). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Immersion techniques have been introduced into lithographic systems to enable improved resolution of smaller features. In an immersion lithographic apparatus, a liquid layer of immersion liquid having a relatively high refractive index is interposed in the immersion space 11 between a projection system PS of the apparatus (through which the patterned beam is projected towards the substrate W) and the substrate W. The immersion liquid covers at least the part of the substrate W under a final element of the projection system PS. Thus, at least the portion of the substrate W undergoing exposure is immersed in the immersion liquid.

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space 11 as immersion liquid. Other liquids with a high refractive index can be used besides water as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the immersion space 11 between the final element 100 and a surface facing the final element 100. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa). A fluid handling structure 12 present between the projection system PS and the substrate support WT is used to confine the immersion liquid to the immersion space 11. The immersion space 11 filled by the immersion liquid is smaller in plan than the top surface of the substrate W and the immersion space 11 remains substantially stationary relative to the projection system PS while the substrate W and substrate support WT move underneath.

Other immersion systems have been envisaged such as an unconfined immersion system (a so-called 'All Wet' immersion system) and a bath immersion system. In an unconfined immersion system, the immersion liquid covers more than the surface under the final element 100. The liquid outside the immersion space 11 is present as a thin liquid film. The liquid may cover the whole surface of the substrate W or even the substrate W and the substrate support WT co-planar with the substrate W. In a bath type system, the substrate W is fully immersed in a bath of immersion liquid.

The fluid handling structure 12 is a structure which supplies the immersion liquid to the immersion space 11, removes the immersion liquid from the immersion space 11 and thereby confines the immersion liquid to the immersion space 11. It includes features which are a part of a fluid supply system. The arrangement disclosed in PCT patent application publication no. WO 99/49504 is an early fluid handling structure comprising pipes which either supply or recover the immersion liquid from the immersion space 11 and which operate depending on the relative motion of the stage beneath the projection system PS. In more recent designs, the fluid handling structure extends along at least a part of a boundary of the immersion space 11 between the final element 100 of the projection system PS and the substrate support WT or substrate W, so as to in part define the immersion space 11.

The fluid handing structure 12 may have a selection of different functions. Each function may be derived from a corresponding feature that enables the fluid handling structure 12 to achieve that function. The fluid handling structure 12 may be referred to by a number of different terms, each referring to a function, such as barrier member, seal member, fluid supply system, fluid removal system, liquid confinement structure, etc.

As a barrier member, the fluid handling structure 12 is a barrier to the flow of the immersion liquid from the immersion space 11. As a liquid confinement structure, the structure confines the immersion liquid to the immersion space 11. As a seal member, sealing features of the fluid handling structure 12 form a seal to confine the immersion liquid to the immersion space 11. The sealing features may include an additional gas flow from an opening in the surface of the seal member, such as a gas knife.

In an embodiment the fluid handling structure 12 may supply immersion fluid and therefore be a fluid supply system.

In an embodiment the fluid handling structure 12 may at least partly confine immersion fluid and thereby be a fluid confinement system.

In an embodiment the fluid handling structure 12 may provide a barrier to immersion fluid and thereby be a barrier member, such as a fluid confinement structure.

In an embodiment the fluid handling structure 12 may create or use a flow of gas, for example to help in controlling the flow and/or the position of the immersion fluid.

The flow of gas may form a seal to confine the immersion fluid so the fluid handling structure 12 may be referred to as a seal member; such a seal member may be a fluid confinement structure.

In an embodiment, immersion liquid is used as the immersion fluid. In that case the fluid handling structure 12 may be a liquid handling system. In reference to the aforementioned description, reference in this paragraph to a feature defined with respect to fluid may be understood to include a feature defined with respect to liquid.

A lithographic apparatus has a projection system PS. During exposure of a substrate W, the projection system PS projects a beam of patterned radiation onto the substrate W. To reach the substrate W, the path of the radiation beam B passes from the projection system PS through the immersion liquid confined by the fluid handling structure 12 between the projection system PS and the substrate W. The projection system PS has a lens element, the last in the path of the beam, which is in contact with the immersion liquid. This lens element which is in contact with the immersion liquid may be referred to as 'the last lens element' or "the final element". The final element 100 is at least partly surrounded by the fluid handling structure 12. The fluid handling structure 12 may confine the immersion liquid under the final element 100 and above the facing surface.

FIGS. 2a, 2b, 2c and 2d show different features which may be present in variations of a fluid handling system. The designs may share some of the same features as FIGS. 2a, 2b, 2c and 2d unless described differently. The features described herein may be selected individually or in combination as shown or as required. The figures depict different versions of a fluid handling system with different features illustrated on the left hand side and the right hand side, which may extend around the complete circumference. Thus, for example, the fluid handling system may have the same features extending around the complete circumference. For example, the fluid handling system may have only the features of the left hand side of FIG. 2a, or the right hand side of FIG. 2a, or the left hand side of FIG. 2b, or the right hand side of FIG. 2b, or the left hand side of 2c, or the right hand side of 2c, or the left hand side of 2d, or the right hand side of 2d. Alternatively, the fluid handling system may be provided with any combination of features from these figures at different locations around the circumference. The fluid handling system may comprise the fluid handling structure 12 as described in the variations below.

Figure 2A:
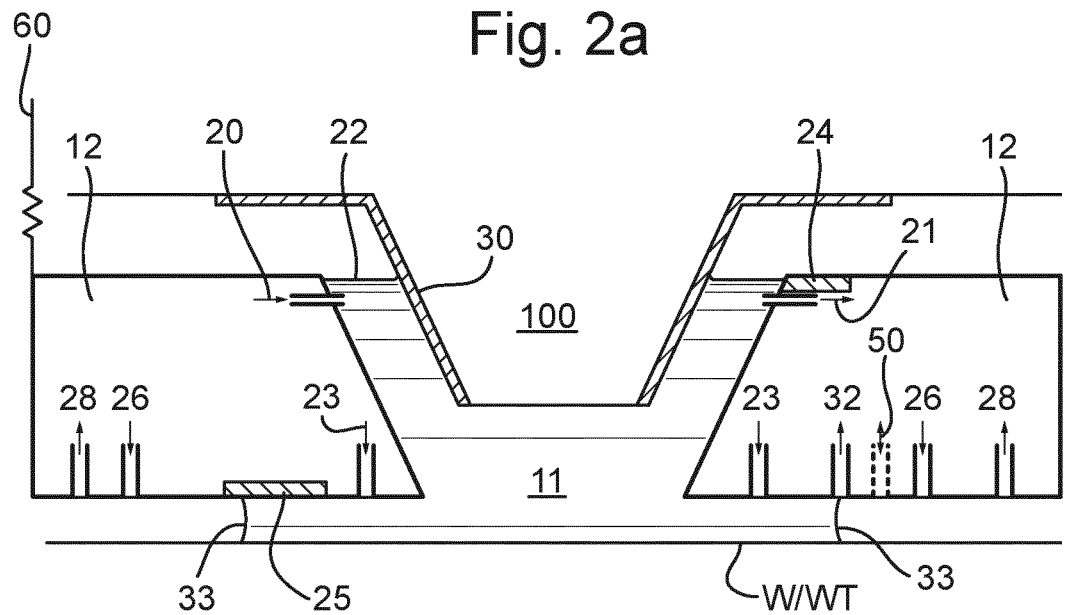
FIGS. 2*a*, 2*b*, 2*c* and 2*d* each depict, in cross section, two different versions of a fluid handling system with different features illustrated on the left hand side and the right hand side of each version, which may extend around the complete circumference.

FIG. 2a shows a fluid handling structure 12 around the bottom surface of the final element 100. The final element 100 has an inverted frusto-conical shape. The frusto-conical shape having a planar bottom surface and a conical surface. The frusto-conical shape protrudes from a planar surface and having a bottom planar surface. The bottom planar surface is the optically active portion of the bottom surface of the final element 100, through which the radiation beam B may pass. The final element 100 may have a coating 30. The fluid handling structure 12 surrounds at least part of the frusto-conical shape. The fluid handling structure 12 has an inner-surface which faces towards the conical surface of the frusto-conical shape. The inner-surface and the conical surface may have complementary shapes. A top surface of the fluid handling structure 12 may be substantially planar. The fluid handling structure 12 may fit around the frusto-conical shape of the final element 100. A bottom surface of the fluid handling structure 12 may be substantially planar and in use the bottom surface may be parallel with the facing surface of the substrate support WT and/or substrate W. Thus, the bottom surface of the fluid handling structure 12 may be referred to as a surface facing the surface of the substrate W. The distance between the bottom surface and the facing surface may be in the range of 30 to 500 micrometers, desirably in the range of 80 to 200 micrometers.

The fluid handling structure 12 extends closer to the facing surface of the substrate W and substrate support WT than the final element 100. The immersion space 11 is therefore defined between the inner surface of the fluid handling structure 12, the planar surface of the frusto-conical portion and the facing surface. During use, the immersion space 11 is filled with immersion liquid. The immersion liquid fills at least part of a buffer space between the complementary surfaces between the final element 100 and the fluid handling structure 12, in an embodiment at least part of the space between the complementary inner-surface and the conical surface.

The immersion liquid is supplied to the immersion space 11 through an opening formed in a surface of the fluid handling structure 12. The immersion liquid may be supplied through a supply opening 20 in the inner-surface of the fluid handling structure 12. Alternatively or additionally, the immersion liquid is supplied from an under supply opening 23 formed in the bottom surface of the fluid handling structure 12. The under supply opening 23 may surround the path of the radiation beam B and it may be formed of a series of openings in an array or a single slit. The immersion liquid is supplied to fill the immersion space 11 so that flow through the immersion space 11 under the projection system PS is laminar or at least well defined. The supply of the immersion liquid from the under supply opening 23 additionally prevents the ingress of bubbles into the immersion space 11. This supply of the immersion liquid may function as a liquid seal.

The immersion liquid may be recovered from a recovery opening 21 formed in the inner-surface. The recovery of the immersion liquid through the recovery opening 21 may be by application of an underpressure; the recovery through the recovery opening 21 as a consequence of the velocity of the immersion liquid flow through the immersion space 11; or the recovery may be as a consequence of both. The recovery opening 21 may be located on the opposite side of the supply opening 20, when viewed in plan. Additionally or alternatively, the immersion liquid may be recovered through an overflow recovery 24 located on the top surface of the fluid handling structure 12. The supply opening 20 and recovery opening 21 can have their function swapped (i.e. the flow direction of liquid is reversed). This allows the direction of flow to be changed depending upon the relative motion of the fluid handling structure 12 and substrate W.

Additionally or alternatively, immersion liquid may be recovered from under the fluid handling structure 12 through a recovery opening 25 formed in its bottom surface. The recovery opening 25 may serve to hold a meniscus 33 of the immersion liquid to the fluid handling structure 12. The meniscus 33 forms between the fluid handling structure 12 and the facing surface and it serves as border between the liquid space and the gaseous external environment. The recovery opening 25 may be a porous plate which may recover the immersion liquid in a single phase flow. The recovery opening in the bottom surface may be a series of pinning openings 32 through which the immersion liquid is recovered. The pinning openings 32 may recover the immersion liquid in a two phase flow.

Optionally radially outward, with respect to the inner-surface of the fluid handling structure 12, is a gas knife opening 26. Gas may be supplied through the gas knife opening 26 at elevated speed to assist liquid confinement of the immersion liquid in the immersion space 11. The supplied gas may be humidified and it may contain substantially carbon dioxide. Radially outward of the gas knife opening 26 is a gas recovery opening 28 for recovering the gas supplied through the gas knife opening 26.

Further openings, for example open to atmosphere or to a gas source or to a vacuum, may be present in the bottom surface of the fluid handling structure 12, i.e. in the surface of the fluid handling structure 12 facing the substrate W. An example of such an optional further opening 50 is shown in dashed lines on the right hand side of FIG. 2a. As shown, the further opening 50 may be a supply or extraction member, which is indicated by the double-headed arrow. For example, if configured as a supply, the further opening 50 may be connected to a liquid supply or a gas supply as with any of the supply members. Alternatively, if configured as an extraction, the further opening 50 may be used to extract fluid, and may for example, be connected to atmosphere or to a gas source or to a vacuum. For example, the at least one further opening 50 may be present between gas knife opening 26 and gas recovery opening 28, and/or between pinning openings 32 and gas knife opening 26. In an alternative arrangement, the fluid handling structure 12 may contain the pinning opening 32, gas knife opening 26 and optionally the under supply opening 23. The supply opening 20 or recovery opening 21 may be formed in the inner surface of the fluid structure 12.

The two different versions of the fluid handling structure 12 of the left and right sides of FIG. 2a pin the meniscus 33. The version of the fluid handling structure 12 on the right hand side of FIG. 2a may pin the meniscus 33 at a position that is substantially fixed with respect to the final element 100, due to the fixed position of the pinning opening 32. The version of the fluid handling structure 12 on the left hand side of FIG. 2a may pin the meniscus 33 below the recovery opening 25, and thus the meniscus 33 may move along the length and/or width of the recovery opening 25. For the radiation beam B to be directed to a full side of the substrate W under exposure, the substrate support WT supporting the substrate W is moved relative to the projection system PS. To maximize the output of substrates W exposed by the lithographic apparatus, the substrate support WT (and so substrate W) is moved as fast as possible. However, there is a critical relative speed (often referred to as a critical scan speed) above which the meniscus 33 between the fluid handling structure 12 and the substrate W becomes unstable. An unstable meniscus 33 has a greater risk of losing immersion liquid, for example in the form of one or more droplets. Furthermore, an unstable meniscus 33 has a greater risk of resulting in the inclusion of gas bubbles in the immersion liquid, especially when the confined immersion liquid crosses the edge of the substrate W.

A droplet present on the surface of the substrate W may apply a thermal load and may be a source of defectivity. The droplet may evaporate leaving a drying stain, it may move transporting contamination such as a particle, it may collide with a larger body of immersion liquid introducing a bubble of gas into the larger body and it may evaporate, applying the thermal heat load to the surface on which it is located. Such a thermal load could be a cause of distortion and/or a source of a positioning error if the surface is associated with positioning of components of the lithographic apparatus relative to the substrate W being imaged. A formation of a droplet on a surface is therefore is undesirable. To avoid formation of such a droplet, the speed of the substrate support WT is thus limited to the critical scan speed at which the meniscus 33 remains stable. This limits the throughput of the lithographic apparatus.

The left hand side of the fluid handling system in FIG. 2a may comprise a spring 60. The spring 60 may be an adjustable passive spring configured to apply a biasing force to the fluid handling structure 12 in the direction of the substrate W. Thus, the spring 60 can be used to control the height of the fluid handling structure 12 above the substrate W. Such adjustable passive springs are described in U.S. Pat. No. 7,199,874 which is herein incorporated by reference in its entirety. Other bias devices may also be appropriate, for example, using an electromagnetic force. Although the spring 60 is shown with the left hand side of FIG. 2a, it is optional and does not need to be included with the other features of the left hand side of FIG. 2a. The spring 60 is not shown on any of the other figures, but could also be included with the other variations of the fluid handling system described in relation to FIG. 2a, 2b, 2c, or 2d.

Figure 2B:
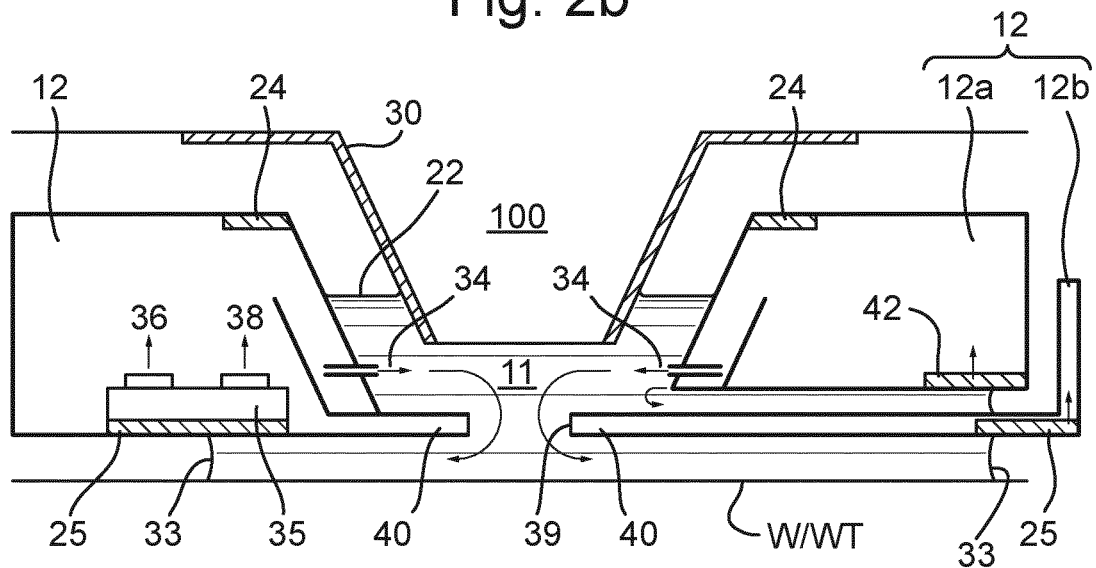

FIG. 2b shows two different versions of the fluid handling structure 12 on its left side and on its right side, which allow movement of the meniscus 33 with respect to the final element 100. The meniscus 33 may move in the direction of the moving substrate W. This decreases the relative speed between the meniscus 33 and the moving substrate W, which may result in improved stability and a reduced risk of breakdown of the meniscus 33. The speed of the substrate W at which the meniscus 33 breaks down is increased so as to allow faster movement of the substrate W under the projection system PS. Throughput is thus increased.

Features shown in FIG. 2b which are common to FIG. 2a share the same reference numbers. The fluid handling structure 12 has an inner surface which complements the conical surface of the frusto-conical shape. The bottom surface of the fluid handling structure 12 is closer to the facing surface than the bottom planar surface of the frusto-conical shape.

Immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B.

Immersion liquid is recovered from the immersion space 11 through recovery openings 25, in the bottom surface of the fluid handling structure 12. As the facing surface moves under the fluid handling structure 12, the meniscus 33 may migrate over the surface of the recovery opening 25 in the same direction as the movement of the facing surface. The recovery openings 25 may be formed of a porous member. The immersion liquid may be recovered in single phase. The immersion liquid may be recovered in a two phase flow. The two phase flow is received in a chamber 35 within the fluid handling structure 12 where it is separated into liquid and gas. The liquid and gas are recovered through separate channels 36, 38 from the chamber 35.

An inner periphery 39 of the bottom surface of fluid handling structure 12 extends into the immersion space 11 away from the inner surface to form a plate 40. The inner periphery 39 forms a small aperture which may be sized to match the shape and size of the radiation beam B. The plate 40 may serve to isolate the immersion liquid at either side of it. The supplied immersion liquid flows inwards towards the aperture, through the inner aperture and then under the plate 40 radially outwardly towards the surrounding the recovery openings 25.

The fluid handling structure 12 may be in two parts as shown on the right hand side of FIG. 2b: an inner part 12a and an outer part 12b. The inner part 12a and the outer part 12b may move relatively to each other, mainly in a plane parallel to facing surface. The inner part 12a may have the supply openings 34 and it may have the overflow recovery 24. The outer part 12b may have the plate 40 and the recovery opening 25. The inner part 12a may have an intermediate recovery 42 for recovering the immersion liquid which flows between the inner part 12a and the outer part 12b.

The two different versions of the fluid handling structure of FIG. 2b thus allow for movement of the meniscus 33 in the same direction as the substrate W, enabling faster scan speeds and increased throughput of the lithographic apparatus. However, the migration speed of meniscus 33 over the surface of the recovery opening 25 in the fluid handling structure 12 of the left side of FIG. 2b may be slow. The fluid handling structure 12 of the right side of FIG. 2b allows for quicker movement of the meniscus 33, by moving the outer part 12b with respect to the inner part 12a and the final element 100. However, it may be difficult to control the intermediate recovery 42 so as to ensure that enough immersion liquid is provided between the inner part 12a and the outer part 12b to prevent contact therebetween. Implementations may also include a liquid supply being provided in the moving outer part 12b.

Figure 2C:
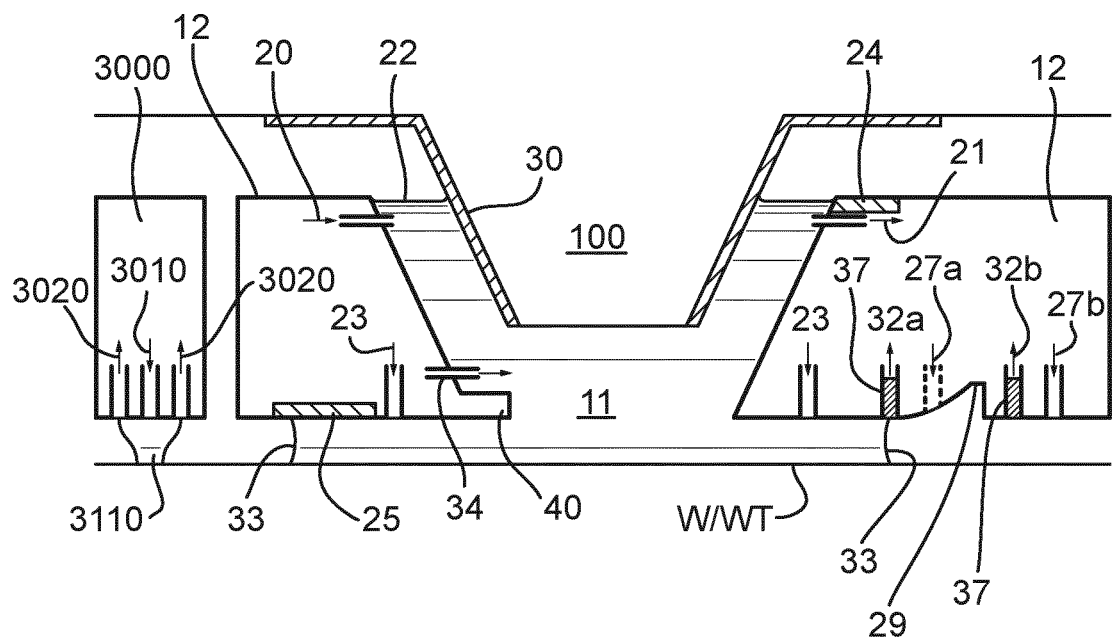

FIG. 2c shows two different versions of the fluid handling structure 12 on its left side and on its right side, which may be used to pin the meniscus 33 of the immersion liquid to the fluid handling structure 12 as described above in relation to FIGS. 2a and/or 2b. Features shown in FIG. 2c which are common to FIGS. 2a and/or 2b share the same reference numbers.

The fluid handling structure 12 has an inner surface which compliments the conical surface of the frusto-chronical shape. The bottom surface of the fluid handling structure 12 is closer to the facing surface than the bottom planar surface of the frusto-chronical shape. Immersion liquid is supplied to the immersion space 11 delivered through an opening formed in a surface of the fluid handling structure 12. The immersion liquid may be supplied through a supply opening 34 in the inner surface of the fluid structure 12. Alternatively or additionally, the immersion liquid may be supplied through a supply opening 20 in the inner surface of the fluid structure 12. Alternatively or additionally, the immersion liquid is supplied through the under supply opening 23. The immersion liquid may be recovered via an extraction member, for example, via recovery opening 21 formed in the inner-surface and/or overflow recovery 24 and/or one or more openings in a surface of the fluid handling structure 12 as described below.

The two different versions of the fluid handling structure 12 of the left and right sides of FIG. 2c pin the meniscus 33. The version of the fluid handling structure 12 on the right hand side of FIG. 2c may pin the meniscus 33 at a position that is substantially fixed with respect to the final element 100, due to the fixed position of the recovery opening 32a. The version of the fluid handling structure 12 on the left hand side of FIG. 2c may pin the meniscus 33 below the recovery opening 25, and thus the meniscus 33 may move along the length and/or width of the recovery opening 25.

As described above in relation to FIG. 2b, an inner periphery of the bottom surface of fluid handling structure 12 may extends into the immersion space 11 away from the inner surface to form a plate 40 as shown on the left hand side. As described above, this may form a small aperture, and may isolate the immersion liquid at either side and/or cause immersion liquid to flow inwards towards the aperture, through the inner aperture and then under the plate 40 radially outwardly towards the surrounding the recovery openings 25. Although this features is shown on the left hand side in FIG. 2c, it is optional in combination with the other features shown. Preferably, as shown on the left hand side, immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B. Alternatively or additionally, the immersion liquid may be supplied through a supply opening 20 in the inner surface of the fluid structure 12. Alternatively or additionally, the immersion liquid is supplied through the under supply opening 23. Although the supply openings 34 are the preferred liquid supply, any combination of supply openings 34, supply openings 20 and/or under supply openings 23 may be provided.

As shown on the left hand side of FIG. 2c, a fluid handling system may comprise the fluid handling structure 12 as described above and a further device 3000. The fluid handling structure 12 may have an extraction member, such as recovery opening 25, and a liquid supply opening, such as the under supply opening 23. It will be understood that the fluid handling structure 12 may comprise any configuration as disclosed in relation to the left hand of FIG. 2a, the right hand side of FIG. 2a, the left hand side of FIG. 2b, the right hand side of FIG. 2b or (as described below) the right hand side of FIG. 2c, in combination with the further device 3000.

The further device 3000 may otherwise be referred to as a droplet catcher. The further device 3000 is provided to reduce occurrence of liquid on the surface of the substrate W after the fluid handling structure 12 has moved over the surface. The further device 3000 may comprise a liquid supply member 3010 and at least one extraction member 3020. The at least one extraction member 3020 may be formed in a shape surrounding the at least one supply member 3010 in plan. The at least one liquid supply member 3010 may be configured to provide a further liquid to a space 3110 between at least a part of the further device 3000 and the surface of the substrate W. The further device 3000 may be configured to recover at least some of the liquid via the at least one extraction member 3020. The further device 3000 may be used to incorporate any liquid left on the surface of the substrate W with the liquid in the space 3110 and then use the further device 3000 to extract the liquid such that the amount of liquid remaining on the surface of the substrate W is reduced.

The further device 3000 is shown as a separate device from the fluid handling structure 12 in FIG. 2c. The further device 3000 may be positioned adjacent to the fluid handling structure 12. Alternatively, the further device 3000 may be part of, i.e. integral to, the fluid handling structure 12 (as in FIG. 2d, however, either arrangement can be selected).

The further device 3000 may be configured to provide a liquid to the space 3110 which is separate from the liquid provided by the fluid handling structure 12.

Additionally or alternatively, the fluid handling structure 12 may have the components as shown on the right hand side of FIG. 2c. More specifically, the fluid handling structure 12 may comprise the at least one liquid supply member, two extraction members (e.g., recovery openings 32a and 32b) and two gas supply members (e.g., gas supply openings 27a and 27b) formed on the surface of the fluid handling structure 12. Gas supply opening 27a can be omitted, i.e. is optional. The at least one liquid supply member may be the same as the under supply opening 23 in the bottom surface of the fluid handling structure 12 described above or the supply opening 20 or liquid supply openings 34 formed on the inner surface of the fluid handling structure 12 described in relation to left hand side of FIG. 2b. The liquid supply member, the extraction members and the gas supply members may be formed on the surface of the fluid handling structure 12. Specifically, these components may be formed on a surface of the fluid handling structure 12 facing the substrate W, i.e. the bottom surface of the fluid handling structure 12.

At least one of the two extraction members may comprise a porous material 37 therein. The porous material 37 may be provided within an opening, e.g., recovery opening 32a through which fluid handling structure 12 extracts fluid from below the fluid handling structure 12 and may recover the immersion liquid in a single phase flow. The other of the two extraction members, e.g., recovery opening 32b may recover the immersion fluid as a dual phase extractor. The porous material 37 does not need to be flush with the bottom surface of the fluid handling structure 12.

Specifically, the fluid handling structure 12 may comprise the liquid supply member (e.g., under supply opening 23), with a first extraction member (e.g., recovery opening 32a) radially outwards of the liquid supply member, and a first gas supply member (e.g., gas supply opening 27a) radially outwards of the first extraction member, and the second extraction member (e.g., recovery opening 32b) radially outwards of the first gas supply member, and a second gas supply member (e.g., gas supply opening 27b) radially outwards of the second extraction member. Similar to FIG. 2a, further openings, for example open to atmosphere or to a gas source or to a vacuum, may be present in the bottom surface of the fluid handling structure 12 as described previously (in relation to the fluid handling structure 12).

For example, at least one further opening (not shown) may be provided in the bottom surface of the fluid handling structure 12. The further opening is optional. The further opening may be arranged between the first extraction member (e.g., recovery opening 32a) and the first gas supply member (e.g., gas supply opening 27a) as described in the arrangement above. Alternatively or additionally, the further opening may be arranged between the second extraction member (e.g., recovery opening 32b) and the second gas supply member (e.g., gas supply opening 27b) as described in the arrangement above. The further opening may be the same as further opening 50 described above.

Optionally, the fluid handling structure 12 comprises a recess 29. The recess 29 may be provided between the recovery opening 32a and recovery opening 32b or gas supply opening 27a and recovery opening 32b. The shape of the recess 29 may be uniform around the fluid handling structure 12 and may optionally contain an inclined surface. In the case of the recess 29 provided between the recovery opening 32a and recovery opening 32b, the gas supply opening 27b may be provided on the inclined surface as shown in FIG. 2c. In the case of the recess 29 provided between the supply opening 27a and recovery opening 32b, the gas supply opening 27b may be provided on the inclined surface or a part of the bottom surface of the fluid handling structure 12 which is parallel to the surface of the substrate W. Alternatively, the shape of the recess 29 may vary around the circumference of the fluid handling structure 12. The shape of the recess 29 may be varied to alter the impact of gas supplied from the gas supply members on the fluid below the fluid handling structure 12. The recess 29 may alternatively be a negative recess, i.e. a protruding structure, that narrows the separation between the fluid handling structure 12 and the substrate W.

Figure 2D:
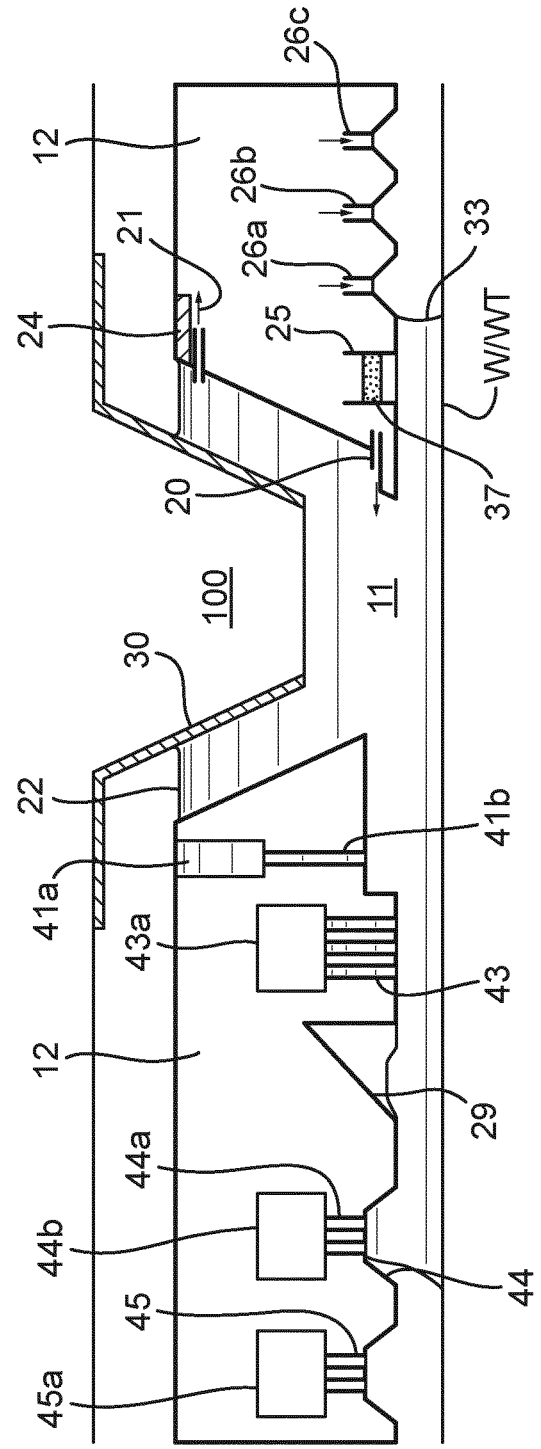

FIG. 2d shows, in its left and right halves, two different versions of the fluid handling structure 12. The fluid handling structure 12 of the left half of FIG. 2d has a liquid injection buffer 41a, which holds a buffer amount of immersion liquid, and liquid injection holes 41 which supply immersion liquid from the liquid injection buffer to the space 11. Outwardly of the liquid injection holes 41 are inner liquid recovery apertures 43 for conducting liquid to an inner recovery buffer 43a which is provided with a porous member. A recess 29 similar to that described relating to FIG. 2c is provided outward of the inner liquid recovery apertures 43. Outward of the recess 29, in the lower face of the fluid handling structure 12 is a gas guiding groove 44 into which open outer recovery holes 44a. The outer recovery holes 44a lead a two-phase recovery flow to outer recovery buffer 44b which is also provided with a porous member. Outermost are gas sealing holes 45 which communicate between a gas sealing buffer volume 45a and the space underneath the fluid handling structure 12 to provide a gas flow to contain the immersion liquid. In the above-described implementations, the meniscus 33 may to pinned to the recovery opening 32a or it may be moveable.

The fluid handling structure 12 of the right half of FIG. 2d has a liquid supply opening 20 in the inner inclined face thereof. In the underside of the fluid handling structure 12 there are (from inner side to outer side) an extraction opening 25 provided with a porous member 37; a first gas knife opening 26a, a second gas knife opening 26b and a third gas knife opening 26c. Each of these openings opens into a groove in the underside of the fluid handling structure 12 that provides a buffer volume. The outermost part of the fluid handling structure 12 is stepped so as to provide a greater separation between the fluid handling structure 12 and the substrate W.

FIGS. 2a-2d show examples of different configurations which can be used as part of a fluid handling system. It will be understood that the examples provided above refer to specific extraction members and recovery members, but it is not necessary to use the exact type of extraction member and/or recovery member. In some cases different terminology is used to indicate the position of the member, but the same functional features may be provided. Examples of the extraction member referred to above include recovery opening 21, overflow recover 24, recovery opening 25 (possibly comprising a porous plate and/or the chamber 35), gas recovery opening 28, pinning opening 32, recovery opening 32a, recovery opening 32b and/or the intermediate recovery 42. Examples of the supply member referred to above include supply opening 20, under supply opening 23, gas knife opening 26, gas supply opening 27a, gas supply opening 27b, and/or supply openings 34. In general, an extraction member used to extract/recover fluid, liquid or gas is interchangeable with at least any of the other examples used which extract/recover fluid, liquid or gas respectively. Similarly, a supply member used to supply fluid, liquid or gas is interchangeable with at least any of the other examples used which supply fluid, liquid or gas respectively. The extraction member may extract/recover fluid, liquid or gas from a space by being connected to an underpressure which draws the fluid, liquid or gas into the extraction member. The supply member may supply fluid, liquid or gas to the space by being connected to a relevant supply.

As described earlier, the immersion liquid may be extracted from the immersion space 11, which is also referred to herein as a liquid confinement space 11, by an extraction member. As shown in FIGS. 2a, 2c and 2d, the extraction member may be a recovery opening 21. The extraction member may be located on the opposite side of the supply opening 20, when viewed in plan. The extraction member may extract both liquid and gas. The supply opening 20 may supply liquid. Both the extraction member and the supply opening 20 may be provided in an inner-surface, that is a wall, that faces towards the conical surface of the frusto-conical shape of the final element 100. There may therefore be a continuous flow of water through the liquid confinement space 11 around the final element 100.

There is a general need to increase the movement speeds within a lithographic apparatus to allow faster operation of the lithographic apparatus. The throughput of a lithographic apparatus may thereby be increased. During operation of the lithographic apparatus, the fluid handling system may not be configured to substantially move horizontally, i.e. in the x-direction and/or y-direction. The main relative movement between the fluid handling system and the substrate W and/or the substrate support WT may be caused by the substrate W being moved horizontally by the substrate support WT. The fluid handling system may be moved vertically, i.e. in the z-direction, and rotatable about the x-axis and y-axis, i.e. moved in Rx and Ry. In an alternative implementation, the fluid handling system may be configured to moved horizontally.

A problem that may be experienced when the movement speeds within the lithographic apparatus are increased is that the amount of liquid sloshing is increased. Sloshing is described below with reference to FIG. 3.

Figure 3:
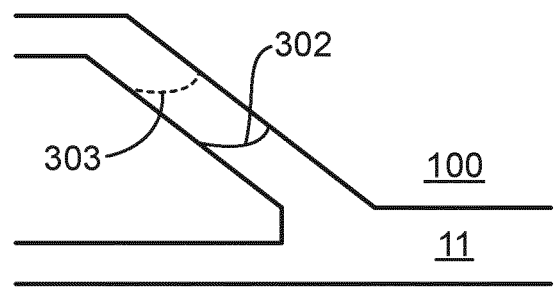
FIG. 3 depicts a schematic cross-section through a part of a fluid handling system.

FIG. 3 shows a schematic cross-section through a part of a fluid handling system that comprises the inner surface of the liquid confinement space 11 around the final element 100. Not shown in FIG. 3 is an extraction member or supply opening 20 that may also be present in the inner-surface. The movement, as well as the acceleration, of the substrate W and/or substrate support WT may exert drag forces on the liquid of the fluid handling system. This may cause changes in the liquid level 302, 303 as the liquid is dragged along. For example, as shown in FIG. 3, the liquid level 302, 303 may vary between a liquid high level 303 and a liquid low level 302. The change of liquid level 302, 303 is referred to herein as sloshing. The amount of sloshing may be the difference between the liquid high level 303 and a liquid low level 302. The amount of sloshing may be larger than that shown in FIG. 3 and liquid overflow may occur.

Sloshing may cause a number of problems that adversely affect the performance of the fluid handling system. The surfaces between the liquid high level 303 and the liquid low level 302 are sometimes covered by liquid and at other times wet surfaces exposed to a gas. The same surface in these two different conditions may have substantially different thermal properties. In particular, a wet surface exposed to a gas may be uncontrolled evaporative cold spot. Changes of thermal properties of surfaces in the fluid handling system may increase thermal overlay errors and also cause control problems. Sloshing may also apply uncontrolled forces on the final element 100. These may result in, e.g., uncontrolled displacements, degrade performance and imaging deterioration.

Embodiments of the present invention may reduce the amount of sloshing that occurs. The movement speed, acceleration and deceleration of the substrate W and/or substrate support WT may all thereby be increased without problems caused by sloshing being prohibitive. Embodiments of the present invention may be used in all types of localised immersion lithography apparatus.

The inventors have realised that the amount of sloshing that occurs may be less at the extraction member than at other locations around the perimeter, that may be the circumference, of the inner-surface. The amount to sloshing may therefore be deceased by increasing the extent that the extraction member extends around the perimeter of the inner-surface.

Embodiments include techniques for increasing the extent that the extraction member extends around the perimeter of the inner-surface.

The inventors have also realised that thermal performance may be improved if only liquid is extracted through the extraction member. That is to say, the extraction through the extraction member acts as a single phase extraction. Such a single phase extraction may reduce and/or prevent, cold spots occurring due to wet surfaces being exposed to gas. In particular, there may be no cold spots in the fluid extraction channel that receives liquid from the extraction member.

Embodiments also include techniques for ensuring that substantially only liquid is extracted through the extraction member.

Figure 4A:
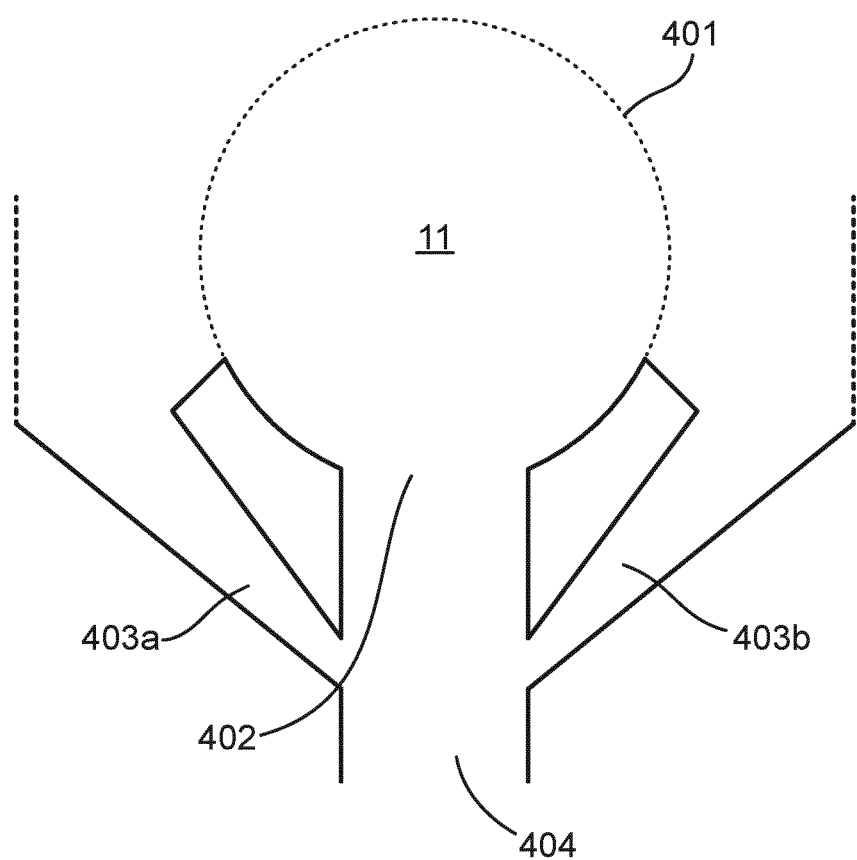
FIG. 4A depicts a schematic plan view of part of the fluid handling system according to a first implementation of an embodiment.
Figure 4B:
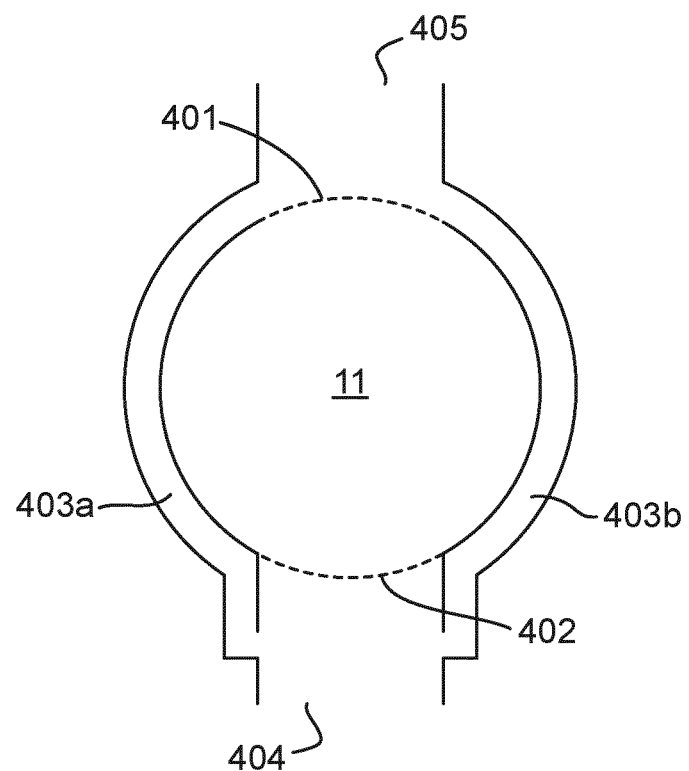
FIG. 4B depicts a schematic plan view of part of the fluid handling system according to a second implementation of an embodiment.

FIGS. 4A and 4B schematically shows a plan view of part of the fluid handling system according to first and second implementations of an embodiment.

FIG. 4A schematically shows the first implementation of an embodiment. FIG. 4A shows a liquid confinement space 11, a liquid supply conduit 404, a liquid supply opening 402, an extraction member 401, a first liquid bypass channel 403a and a second liquid bypass channel 403b. Although not shown in FIG. 4A, there may also be a liquid extraction conduit for receiving liquid on an outlet side of the extraction member 401.

The liquid supply opening 402 may be substantially the same as the earlier described supply opening 20. The liquid supply opening 402 may receive immersion liquid from the liquid supply conduit 404.

The extraction member 401 comprises an inlet side and an outlet side. Liquid flows through the extraction member 401 from the inlet side to the outlet side. As shown in FIG. 4A, the first liquid bypass channel 403a and a second liquid bypass channel 403b each provide flow paths from the liquid supply conduit 404 to the outlet side of extraction member 401. The outlet side of the extraction member may therefore receive first and second liquid flows. The first liquid flow, through the extraction member 401, is of liquid in the liquid confinement space 11. The second liquid flow, through the first liquid bypass channel 403a and a second liquid bypass channel 403b, is of liquid that has a different source than the liquid confinement space 11.

The extraction member 401 may comprise, for example a sieve or a porous member. In particular, the extraction member 401 may be a metal sheet that comprises a large number of openings. The number of openings may be, for example, between 1000 and 50000. The diameter of each opening may be less than 200 µm, and preferably less than 50 µm.

The extraction member 401 may comprise a hydrophobic material in and/or around the openings. This may help to provide a single phase flow through the extraction member 401.

As shown in FIG. 4A, the extraction member 401 may extend around the substantial part of the perimeter of the inner-surface of the liquid confinement space 11. Accordingly, when the extraction member 401 and liquid supply opening 402 are located in the same plane (i.e. at a similar height with respect to the substrate W and or the substrate support WT) then, in the plane in which the extraction member 401 and liquid supply opening 402 are located, the substantial part of the perimeter of the inner-surface of the liquid confinement space 11 may be occupied by the extraction member 401 and liquid supply opening 402. Embodiments also include implementations in which the extraction member 401 and liquid supply opening 402 are located in different planes. For example, the liquid supply opening 402 may be located further away from the substrate W than the extraction member 401. In such an implementation, in plan view, the substantial part of the perimeter of the inner-surface of the liquid confinement space 11 may be occupied by the extraction member 401 and liquid supply opening 402.

As shown in FIG. 4A, when the extraction member 401 and liquid supply opening 402 are located in the same plane (i.e. at a similar height with respect to the substrate W), there may be wall sections between adjacent ends of the extraction member 401 and liquid supply opening 402. Embodiments include the wall sections occupying less of the perimeter of the inner-surface of the liquid confinement space 11 than shown in FIG. 4A. The extraction member 401 may thereby extend round a larger extent of the perimeter of the inner-surface of the liquid confinement space 11 than shown in FIG. 4A.

The extraction member 401, according to the first implementation of an embodiment shown in FIG. 4A, differs from known implementations of extraction members which occupy the same, or a similar, amount of the perimeter of the inner-surface of the liquid confinement space 11 as the supply opening 20. Advantageously, when the extraction member 401 extends round the substantial extent of the perimeter of the inner-surface of the liquid confinement space 11, the amount of sloshing may be reduced.

Figure 5:
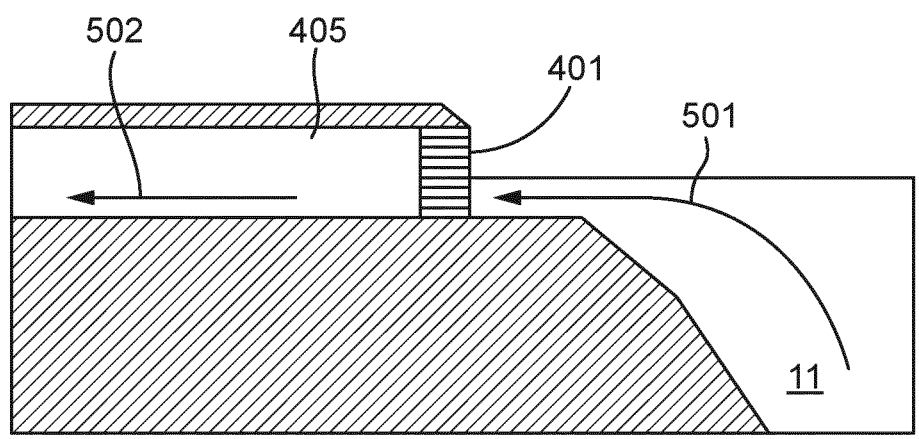
FIG. 5 depicts a cross-section through an extraction member according to an embodiment.

FIG. 5 schematically shows a cross-section through an implementation of an extraction member 401 according to an embodiment. The cross-section in FIG. 5 is in an orthogonal plane to the plan view cross-sections shown in FIGS. 4A and 4B.

FIG. 5 shows an extraction member 401 and a liquid extraction conduit 405. There is a flow path 501 of liquid from the liquid confinement space 11 to the inlet side of the extraction member 401. There is also a flow path 502 of liquid from the outlet side of the extraction member 401 and through the liquid extraction conduit 405.

As shown in FIG. 5, the level of the liquid in the liquid confinement space 11 may be on the inlet side of the extraction member 401. That is to say, part of the inlet side of the extraction member 401 is in contact with liquid and part of the inlet side of the extraction member 401 is in contact with gas.

The extraction member 401 may be located so that, when there is no relative movement between the fluid handling system and the substrate W, the level of the liquid in the liquid confinement space 11 is entirely below all of the inlet side of the extraction member 401. However, when there is relative movement between the substrate W and the fluid handling system (e.g. when the substrate W is moved), the movement may cause part of the level of the liquid to rise so that, for at least part of the extraction member 401, the level of the liquid is on the inlet side of the extraction member 401. That is to say, as shown in FIG. 5, the level of the liquid is on the inlet side of the extraction member 401 because it is neither entirely above nor entirely below the vertical extent of the inlet side of the extraction member 401.

The extraction member 401 may alternatively be located so that, when there is no relative movement between the fluid handling system and the substrate W and/or the substrate support WT, the level of the liquid in the liquid confinement space 11 is entirely above all of the inlet side of the extraction member 401. However, when there is relative movement between the substrate W and/or substrate support WT and the fluid handling system (e.g. when the substrate W and/or substrate support WT is moved), the movement may cause part of the level of the liquid to drop so that, for at least part of the extraction member 401, the level of the liquid is on the inlet side of the extraction member 401. That is to say, as shown in FIG. 5, the level of the liquid is on the inlet side of the extraction member 401 because it is neither entirely above nor entirely below the vertical extent of the inlet side of the extraction member 401.

The extraction member 401 may alternatively be located so that, when there is no relative movement between the fluid handling system and the substrate W and/or the substrate support WT, the level of the liquid in the liquid confinement space 11 is on the inlet side of the extraction member 401. That is to say, as shown in FIG. 5, the level of the liquid is on the inlet side of the extraction member 401 because it is neither entirely above nor entirely below the vertical extent of the inlet side of the extraction member 401.

As described earlier, it is preferable for substantially all of the fluid flow through the extraction member 401 to be liquid. Accordingly, when part, or all, of the inlet side of the extraction member 401 is in contact with gas, it is necessary for the fluid flow through the extraction member 401 to remain only liquid (i.e. single phase).

Embodiments may maintain a substantially only liquid flow through the extraction member 401 by keeping substantially all of the outlet side of the extraction member 401 wet/submerged with liquid. The outlet side of the extraction member 401 may be kept wet with liquid by the liquid flow from the above described first liquid bypass channel 403a and second liquid bypass channel 403b. Each of the first liquid bypass channel 403a and second liquid bypass channel 403b provides a liquid flow path from the liquid supply conduit 404 to the outlet side of extraction member 401. The first liquid bypass channel 403a and second liquid bypass channel 403b may supply liquid to the base of a channel behind the extraction member 401. The liquid may fill the channel to thereby wet the entire outlet side of the extraction member 401.

As described earlier, the extraction member 401 may comprise, for example a sieve and/or a porous member. In particular, the extraction member 401 may contain a metal sheet that comprises a large number of openings. When the outlet side of the openings are wet with liquid, capillary forces may substantially prevent any gas flow from the inlet side to the outlet side of the extraction member 401.

Advantageously, the bypass flow of liquid to the outlet side of the extraction member 401 ensures that a single phase, i.e. liquid only, flow of liquid is maintained when part, or all, of the inlet side of the extraction member 401 is exposed to gas.

FIG. 4B shows a second implementation of an embodiment. FIG. 4B shows a liquid confinement space 11, a liquid supply conduit 404, a liquid supply opening 402, an extraction member 401, a liquid extraction conduit 405, a first liquid bypass channel 403a and a second liquid bypass channel 403b.

The first liquid bypass channel 403a and the second liquid bypass channel 403b may be configured to wet all of the outlet side of the extraction member 401. This may be performed in the same, or a similar, way to that described earlier with reference to FIGS. 4A and 5.

The second implementation of the embodiment, as shown in FIG. 4B, may only differ from the first implementation, as shown in FIG. 4A, by the extraction member 401 occupying the same, or a similar, amount of the perimeter of the inner-surface of the liquid confinement space 11 as the supply opening 20.

The implementation in FIG. 4B may provide an improvement in thermal stability due to the substantial liquid only flow through the extraction member 401. In particular, the substantial liquid only flow may reduce, or prevent, the occurrence of cold spots in the fluid conduits and/or on the lens surface.

Embodiments also include a number of modifications and variations to the above described techniques.

Embodiments include there being only a single bypass channel for supplying the outlet side of the extraction member 401 with liquid. For example, only one of the first liquid bypass channel 403a and second liquid bypass channel 403b may be provided.

Embodiments include there being more than two bypass channels for supplying the outlet side of the extraction member 401 with liquid.

Embodiments include the use of a valve arrangement for controlling the flow of liquid through each liquid bypass channel. Valve arrangement(s) may be provided for controlling the fluid flow through each conduit in the fluid handling system.

Embodiments include the liquid supply to the outlet side of the extraction member 401 for ensuring that remains wet being a separate liquid supply from the liquid supply conduit 404. That is to say, the liquid supply to the outlet side of the extraction member 401 for ensuring that remains wet may be from a separate liquid source from the liquid supply to the liquid confinement space 11. This avoids the requirement for one or more liquid bypass flows that branch out from the liquid supply conduit 404.

Embodiments include the use of other techniques for ensuring that the flow of liquid through the extraction member 401 remains substantially only liquid when part, or all, of the inlet side of the extraction member 401 is exposed to gas. For example, a design of porous member or sieve may be used that does not allow gas to flow through it. In this embodiment, there may be no bypass flow or separate fluid supply to the outlet side of the extraction member 401.

Embodiments include other shapes of liquid confinement space 11 than those shown in FIGS. 4A and 4B. For example, in plan view, the perimeter of the liquid confinement space 11 may be any of a circular, square, rectangular or star configuration, or any combination thereof.

In the embodiment shown in FIG. 4A, the extraction member 401 extends around the substantial part of the perimeter of the inner-surface of the liquid confinement space 11.

Embodiments alternatively include liquid supply opening 402 extending around the substantial part of the perimeter of the inner-surface of the liquid confinement space 11. Accordingly, when the extraction member 401 and liquid supply opening 402 are located in the same plane (i.e. at a similar height with respect to the substrate W), in the plane in which the extraction member 401 and liquid supply opening 402 are located, the substantial part of the perimeter of the inner-surface of the liquid confinement space 11 may be occupied by the liquid supply opening 402.

When the extraction member 401 and liquid supply opening 402 are located in different planes, i.e., the extraction member 401 is higher than the liquid supply opening 402 or vice versa, the entire or substantial part of perimeter of the inner-surface of the liquid confinement space 11 may be occupied by the extraction member 401 and/or the liquid supply opening 402.

In the above described embodiments, only a single extraction member 401 is described. However, embodiments include there being a plurality of extraction members 401. The plurality of extraction members 401 may be arranged around the perimeter of the liquid confinement space 11.

Embodiments also include the fluid handling system comprising a number of sensors for measuring the conditions in the liquid confinement space 11, or any of the conduits. For example, the fluid handling system may comprise any of temperature, pressure, liquid or other types of sensor. The fluid handling system may be controlled in dependence on measurements by the sensors. For example, valve arrangements for controlling the liquid flows may be operated in dependence the measured pressures. The speed at which the substrate W is moved relative to the fluid handling system may also be controlled in dependence on the sensor measurements.

Embodiments may be incorporated into any of a number of known types of fluid handling systems, such as those shown in FIGS. 2a, 2c and 2d. In particular, the recovery opening 21 may in FIGS. 2a, 2c and 2d may be replaced with an extraction member 401 according to embodiments. Embodiments may be incorporated into any of the fluid handling systems disclosed in any of CN104965392B, CN104597720OB, CN103969964B and CN105045046B, all of which are incorporated herein by reference. CN104597720OB discloses a fluid handling system in which a liquid injection channel is located diametrically opposite a liquid recovery channel so that there is a one directional flow between the liquid injection channel and the liquid recovery channel. A substrate facing, and liquid contacting, surface of the fluid handling system comprises a block that may have a hydrophobic surface. Liquid recovery holes are provided at diametrically opposite ends of the block. The fluid handling system(s) disclosed in CN104597720OB, and the other above-described and referenced fluid handling systems, may be adapted so that a single phase liquid extraction is applied according to the techniques of embodiments. All of the above-described and referenced fluid handling systems may also be adapted so that there is a liquid supply for ensuring that the outlet side of the extraction member is maintained wet.

Embodiments include the presence and use of further features from those specifically described above. In particular, the fluid handling system 301 of embodiments may include one or more pumps for controlling the fluid flows. One or pumps for controlling the fluid flows may additionally, or alternatively, be external to the fluid handling system.

The present invention may provide a lithographic apparatus. The lithographic apparatus may have any/all of the other features or components of the lithographic apparatus as described above. For example, the lithographic apparatus may optionally comprise at least one or more of a source SO, an illumination system IL, a projection system PS, a substrate support WT, etc.

Specifically, the lithographic apparatus may comprise the projection system PS configured to project the radiation beam B towards the region of the surface of a substrate W. The lithographic apparatus may further comprise the fluid handling system as described in any of the above embodiments and variations.

The lithographic apparatus may comprise an actuator configured to move the substrate W relative to the fluid handling system. Thus, the actuator may be used to control the position of the substrate W (or alternatively, the position of the fluid handling system). The actuator could be, or could comprise, the substrate support (e.g., a substrate table) WT and/or a substrate holder constructed to hold the substrate W and/or the second positioner PW configured to accurately position the substrate support WT.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Where the context allows, embodiments of the invention may be implemented in hardware, firmware, software, or any combination thereof. Embodiments of the invention may also be implemented by instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use ambient (non-vacuum) conditions.

Although specific reference may have been made above to the use of embodiments of the invention in the context of optical lithography, it will be appreciated that the invention, where the context allows, is not limited to optical lithography.

Embodiments include the following numbered clauses:

Clause 1: A fluid handling system for a lithographic apparatus, the fluid handling system configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a liquid extraction member, having an inlet side and an outlet side, that is arranged to extract the immersion liquid from the liquid confinement space by a fluid flow from the inlet side to the outlet side; and a further liquid supply to the outlet side of the liquid extraction member arranged so that the outlet side receives liquid from a different source than the liquid confinement space.

Clause 2: The fluid handling system according to clause 1, wherein the further liquid supply is arranged so that the outlet side is wetted by the liquid received from the further liquid supply.

Clause 3: The fluid handling system according to clause 1 or 2, wherein the liquid extraction member comprises a sieve and/or a porous member.

Clause 4: The fluid handling system according to any preceding clause, wherein the inlet side is arranged in a wall of the liquid confinement space.

Clause 5: The fluid handling system according to any preceding clause, wherein the liquid extraction member comprises a single phase extraction member so that, in use, substantially only liquid flows through it.

Clause 6: The fluid handling system according to any preceding clause, wherein the further liquid supply is a first liquid supply and the fluid handling system further comprises a second liquid supply that is arranged to supply the immersion liquid to the liquid confinement space.

Clause 7: The fluid handling system according to clause 6, wherein the second liquid supply is arranged to extend round at least part of the perimeter of the liquid confinement space.

Clause 8: The fluid handling system according to clause 6 or 7, wherein the liquid extraction member is arranged to extend round at least part of the perimeter of the liquid confinement space.

Clause 9: The fluid handling system according to clause 8, wherein the liquid extraction member and the second liquid supply are arranged to cover substantially all of the perimeter of the liquid confinement space.

Clause 10: The fluid handling system according to any of clauses 6 to 9, wherein the liquid extraction member extends round a greater extent of the perimeter of the liquid confinement space than the second liquid supply.

Clause 11: The fluid handling system according to any of clauses 6 to 9, wherein the second liquid supply extends round a greater extent of the perimeter of the liquid confinement space than the liquid extraction member.

Clause 12: The fluid handling system according to any of clauses 6 to 11, further comprising a third liquid supply arranged to supply liquid to both the first liquid supply and to the second liquid supply.

Clause 13: The fluid handling system according to clause 12, wherein the flowpath of liquid from the third liquid supply to the first liquid supply is a bypass flowpath that flows out of the flowpath of liquid from the third liquid supply to the second liquid supply.

Clause 14: The fluid handling system according to clause 12 or 13, wherein the flowpath of liquid from the third liquid supply to the first liquid supply branches out from the flowpath of liquid from the third liquid supply to the second liquid supply.

Clause 15: The fluid handling system according to any of clauses 12 to 14, further comprising a valve arrangement configured to control the flow of fluid through the first liquid supply, second liquid supply and/or third liquid supply.

Clause 16: The fluid handling system according to any preceding clause, wherein, in plan view, the perimeter of the liquid confinement space is any of a circular, square, rectangular or star configuration, or any combination thereof.

Clause 17: The fluid handling system according to any preceding clause, wherein the inlet side of the liquid extraction member is arranged so that it is entirely submerged by immersion liquid when the fluid handling system is stationary.

Clause 18: The fluid handling system according to any preceding clause, wherein the inlet side of the liquid extraction member is arranged so that it is partially exposed to gas when the fluid handling system is in use.

Clause 19: A fluid handling system for a lithographic apparatus, the fluid handling system configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a liquid supply that is a liquid supply to the liquid confinement space; and a liquid extraction member that is arranged to extract substantially only liquid from the liquid confinement space; wherein: the liquid supply is arranged to extend round at least part of the perimeter of the liquid confinement space; the liquid extraction member is arranged to extend round at least part of the perimeter of the liquid confinement space; and the liquid extraction member and the liquid supply cover substantially all of the perimeter of the liquid confinement space.

Clause 20: A lithographic apparatus comprising the fluid handling system of any preceding clause.

Clause 21: The lithographic apparatus according to clause 20, further comprising a positioning system configured to move a substrate holder configured to support the substrate relative to the projection system in a plane substantially parallel to the surface of the substrate.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A fluid handling system for a lithographic apparatus, the fluid handling system configured to confine immersion liquid to a liquid confinement space between a part of a projection system and a surface of a substrate in the lithographic apparatus wherein a radiation beam projected from the projection system can irradiate the surface of the substrate by passing along a path through the immersion liquid, the fluid handling system comprising:
   a liquid extraction member, having an inlet side and an outlet side, that is arranged to extract the immersion liquid from the liquid confinement space by a fluid flow from the inlet side to the outlet side, the liquid extraction member located on an inner surface of the fluid handling system and facing toward the path; and
   a further liquid supply to the outlet side of the liquid extraction member arranged so that the outlet side receives liquid from a different source than the liquid confinement space.

2. The fluid handling system according to claim 1, wherein the further liquid supply is arranged so that the outlet side is wetted by the liquid received from the further liquid supply.

3. The fluid handling system according to claim 1, wherein the liquid extraction member comprises a sieve and/or a porous member.

4. The fluid handling system according to claim 1, wherein the liquid extraction member comprises a single phase extraction member so that, in use, substantially only liquid flows through it.

5. The fluid handling system according to claim 1, wherein the further liquid supply is a first liquid supply and the fluid handling system further comprises a second liquid supply that is arranged to supply the immersion liquid to the liquid confinement space, wherein the second liquid supply is arranged to extend round at least part of the perimeter of the liquid confinement space.

6. The fluid handling system according to claim 5, wherein the liquid extraction member is arranged to extend round at least part of the perimeter of the liquid confinement space.

7. The fluid handling system according to claim 6, wherein the liquid extraction member and the second liquid supply are arranged to cover substantially all of the perimeter of the liquid confinement space.

8. The fluid handling system according to claim 5, wherein the liquid extraction member extends round a greater extent of the perimeter of the liquid confinement space than the second liquid supply, or wherein the second liquid supply extends round a greater extent of the perimeter of the liquid confinement space than the liquid extraction member.

9. The fluid handling system according to claim 5, further comprising a third liquid supply arranged to supply liquid to both the first liquid supply and to the second liquid supply and wherein the flow path of liquid from the third liquid supply to the first liquid supply is a bypass flow path that flows out of the flow path of liquid from the third liquid supply to the second liquid supply.

10. The fluid handling system according to claim 5, further comprising a third liquid supply arranged to supply liquid to both the first liquid supply and to the second liquid supply and wherein the flow path of liquid from the third liquid supply to the first liquid supply branches out from the flow path of liquid from the third liquid supply to the second liquid supply.

11. The fluid handling system according to claim 1, wherein, in plan view, the perimeter of the liquid confinement space is any of a circular, square, rectangular or star configuration, or any combination thereof, and/or wherein the inlet side of the liquid extraction member is arranged so that it is entirely submerged by immersion liquid when the fluid handling system is stationary, and/or wherein the inlet side of the liquid extraction member is arranged so that it is at least partially exposed to gas when the fluid handling system is in use.

12. A fluid handling system for a lithographic apparatus, the fluid handling system configured to confine immersion liquid to a liquid confinement space between a part of a projection system and a surface of a substrate in the lithographic apparatus wherein a radiation beam projected from the projection system can irradiate the surface of the substrate by passing through the immersion liquid, the fluid handling system comprising:
   a liquid supply on an inner surface of the fluid handling system and that is a liquid supply to the liquid confinement space; and
   a liquid extraction member on an inner surface of the fluid handling system and that is arranged to extract substantially only liquid from the liquid confinement space;
   wherein:
      the liquid supply is arranged to extend round at least part of the perimeter of the liquid confinement space;
      the liquid extraction member is arranged to extend round at least part of the perimeter of the liquid confinement space; and
      the liquid extraction member and the liquid supply cover substantially all of the perimeter of the liquid confinement space.

13. A lithographic apparatus comprising the fluid handling system of claim 1.

14. The lithographic apparatus according to claim 13, further comprising a positioning system configured to move a substrate holder configured to support the substrate relative to the projection system in a plane substantially parallel to the surface of the substrate.

15. The fluid handling system according to claim 12, wherein the liquid extraction member is arranged so that it is entirely submerged by immersion liquid when the fluid handling system is stationary.

16. The fluid handling system according to claim 12, wherein the liquid extraction member is arranged so that it is at least partially exposed to gas when the fluid handling system is in use.

17. The fluid handling system according to claim 12, wherein the liquid extraction member comprises a sieve and/or a porous member.

18. The fluid handling system according to claim 12, wherein the liquid extraction member comprises a single phase extraction member so that, in use, substantially only liquid flows through it.

19. The fluid handling system according to claim 12, wherein, in plan view, the perimeter of the liquid confinement space is any of a circular, square, rectangular or star configuration, or any combination thereof.

20. A lithographic apparatus comprising the fluid handling system of claim 12.

* * * * *